United States Patent
Kaneko et al.

(10) Patent No.: US 10,516,859 B2
(45) Date of Patent: Dec. 24, 2019

(54) SOLID-STATE IMAGE SENSOR AND ELECTRONIC DEVICE

(71) Applicant: Sony Semiconductor Solutions Corporation, Kanagawa (JP)

(72) Inventors: Kazuaki Kaneko, Kanagawa (JP); Yoshinori Takagi, Kanagawa (JP); Katsumi Yamagishi, Chiba (JP); Naoki Kawazu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/745,205

(22) PCT Filed: Sep. 9, 2016

(86) PCT No.: PCT/JP2016/076560
§ 371 (c)(1),
(2) Date: Jan. 16, 2018

(87) PCT Pub. No.: WO2017/051722
PCT Pub. Date: Mar. 30, 2017

(65) Prior Publication Data
US 2018/0316898 A1    Nov. 1, 2018

(30) Foreign Application Priority Data

Sep. 24, 2015 (JP) ................. 2015-186566

(51) Int. Cl.
*H04N 5/355* (2011.01)
*H04N 9/04* (2006.01)
(Continued)

(52) U.S. Cl.
CPC ......... *H04N 9/0451* (2018.08); *H01L 27/146* (2013.01); *H04N 5/355* (2013.01);
(Continued)

(58) Field of Classification Search
CPC ................................... H04N 5/35563
(Continued)

(56) References Cited

U.S. PATENT DOCUMENTS 10,027,907 B2 * 7/2018 Nakagawara ........ H04N 5/2355
10,128,284 B2 * 11/2018 Galor Gluskin ...........................
H01L 27/14603
(Continued)

FOREIGN PATENT DOCUMENTS

JP    10-189930 A    7/1998
JP    2011-114680 A    6/2011
(Continued)

OTHER PUBLICATIONS

Written Opinion and English translation thereof dated Nov. 15, 2016 in connection with International Application No. PCT/JP2016/076560.
(Continued)

*Primary Examiner* — Anthony J Daniels
(74) *Attorney, Agent, or Firm* — Wolf, Greenfield & Sacks, P.C.

(57) ABSTRACT

The present technology relates to a solid-state image sensor and an electronic device that can expand a dynamic range while suppressing degradation of image quality.
A solid-state image sensor includes a pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel of at least one color among the output pixels having three or more types of sizes, and a signal processing unit configured to perform synthesis processing for a plurality of the pixel signals from a plurality of the
(Continued)

output pixels having a same color and different sizes. The present technology can be applied to, for example, a CMOS image sensor.

14 Claims, 17 Drawing Sheets

(51) Int. Cl.
 *H01L 27/146* (2006.01)
 *H04N 9/07* (2006.01)
 *H04N 5/369* (2011.01)
 *H04N 9/64* (2006.01)
(52) U.S. Cl.
 CPC ....... *H04N 5/35563* (2013.01); *H04N 5/3696* (2013.01); *H04N 9/07* (2013.01); *H04N 9/646* (2013.01)
(58) Field of Classification Search
 USPC .................................. 348/272, 294, 311, 315
 See application file for complete search history.

(56) References Cited

U.S. PATENT DOCUMENTS

| 2007/0035653 | A1 | 2/2007 | Hong et al. |
| 2009/0309999 | A1* | 12/2009 | Hirai ................... H04N 5/3559 348/241 |
| 2011/0141333 | A1 | 6/2011 | Naruse et al. |
| 2014/0078366 | A1 | 3/2014 | Dokoutchaev et al. |
| 2015/0156412 | A1 | 6/2015 | Kuang et al. |
| 2016/0255289 | A1* | 9/2016 | Johnson ................. H04N 5/355 348/273 |
| 2018/0146148 | A1 | 5/2018 | Kaneko et al. |
| 2018/0269245 | A1* | 9/2018 | Mlinar .............. H01L 27/14607 |

FOREIGN PATENT DOCUMENTS

| JP | 2014-175992 A | 9/2014 |
| JP | 2015-153859 A | 8/2015 |

OTHER PUBLICATIONS

International Preliminary Report on Patentability and English translation thereof dated Apr. 5, 2018 in connection with International Application No. PCT/JP2016/076560.

International Search Report and English translation thereof dated Nov. 15, 2016 in connection with International Application No. PCT/JP2016/076560.

U.S. Appl. No. 15/876,633, filed Jan. 22, 2018, Kaneko et al.

\* cited by examiner

SOLID-STATE IMAGE SENSOR AND ELECTRONIC DEVICE

CROSS-REFERENCE TO RELATED APPLICATIONS

This application claims the benefit under 35 U.S.C. § 371 as a U.S. National Stage Entry of International Application No. PCT/JP2016/076560, filed in the Japanese Patent Office as a Receiving Office on Sep. 9, 2016, which claims priority to Japanese Patent Application Number JP2015-186566, filed in the Japanese Patent Office on Sep. 24, 2015, each of which is hereby incorporated by reference in its entirety.

TECHNICAL FIELD

The present technology relates to a solid-state image sensor and an electronic device, and especially relates to a solid-state image sensor and an electronic device that can expand a dynamic range while suppressing degradation of image quality.

BACKGROUND ART

Conventionally, in a solid-state image sensor that employs a Bayer array, a technology to differentiate sizes of light-receiving elements of two pixels in which a green color filter is arranged, and selectively use pixel signals of the two pixels having different sensitivities according to the amount of incident light, to expand a dynamic range has been proposed (for example, see Patent Document 1).

CITATION LIST

Patent Document

Patent Document 1: Japanese Patent Application Laid-Open No. 10-189930

SUMMARY OF THE INVENTION

Problems to be Solved by the Invention

However, in the technology described in Patent Document 1, the sensitivities of the two pixels are substantially different. Therefore, a phenomenon of unnatural change of colors and brightness in a spatial direction and in a temporal direction may occur near the incident light amount at which the pixel signals to be used are switched.

Further, in the solid-state image sensor device that employs a Bayer array, color information other than the color to be detected is interpolated using color information of peripheral pixels in each pixel. Therefore, false color may occur.

The present technology has been made in view of the foregoing, and is intended to expand a dynamic range while suppressing degradation of image quality.

Solution to Problems

A solid-state image sensor of a first aspect of the present technology includes: a pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel of at least one color among the output pixels, having three or more types of sizes; and a signal processing unit configured to perform synthesis processing for a plurality of the pixel signals from a plurality of the output pixels having a same color and different sizes.

The output pixel of each color can have two or more types of sizes, and in the pattern, a color array of a first pixel group including a plurality of first output pixels and a color array of a second pixel group including a plurality of second output pixels, the second output pixel having a different size from the first output pixel, can be made different.

The first pixel group can surround a periphery of the second pixel group.

At least one of the first output pixels can surround a periphery of one of the second output pixels.

The output pixel of each color can have three or more types of sizes, and in the pattern, a first pixel group including a plurality of first output pixels can surround a periphery of a second pixel group including a plurality of second output pixels, the second output pixel having a different size from the first output pixel, and the second pixel group can surround a periphery of a third pixel group including a plurality of third output pixels, the third output pixel having a different size from the second output pixel.

Each of the output pixels can be configured from one or more unit pixels respectively including light-receiving elements having a same size.

The smallest output pixel can be configured from the one unit pixel, and each of the pixels having the other sizes can be configured from a plurality of the unit pixels.

Each of the output pixels can be formed by a combination of the unit pixels with wiring.

In a case where the signal processing unit synthesizes the plurality of pixel signals from a plurality of the output pixels having a same color and three or more types of sizes, the signal processing unit can select one of the plurality of pixel signals according to an incident light amount and output the selected pixel signal, and can multiply the pixel signals of the output pixels having the second and following sizes by a predetermined coefficient and output the multiplied pixel signals.

In a case where the signal processing unit synthesizes the plurality of pixel signals from a plurality of the output pixels having a same color and three or more types of sizes, the signal processing unit can select two of the plurality of pixel signals according to an incident light amount, and output a signal obtained by synthesizing the selected pixel signals at a predetermined ratio.

An electronic device of a second aspect of the present technology includes: a solid-state image sensor; and a first signal processing unit configured to process a signal output from the solid-state image sensor, the solid-state image sensor including a pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel of at least one color among the output pixels having three or more types of sizes, and a second signal processing unit configured to perform synthesis processing for a plurality of the pixel signals from a plurality of the output pixels having a same color and different sizes.

A solid-state image sensor of a third aspect of the present technology includes: a pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel having two or more types of sizes for each color, and in the pattern, a color array of a first pixel group including a plurality of first output pixels and a color array of a second pixel group including a plurality of second output pixels, the second output pixel having a different size from the first output pixel, are different; and a signal processing unit configured to perform synthesis processing for a plurality of the pixel signals from a plurality of the output pixels having a same color and different sizes.

The first pixel group can surround a periphery of the second pixel group.

At least one of the first output pixels can surround a periphery of one of the second output pixels.

Each of the output pixels can be configured from one or more unit pixels respectively including light-receiving elements having a same size.

The smallest output pixel can be configured from the one unit pixel, and each of the pixels having the other sizes can be configured from a plurality of the unit pixels.

Each of the output pixels can be formed by a combination of the unit pixels with wiring.

An electronic device of a fourth aspect of the present technology includes: a solid-state image sensor; and a first signal processing unit configured to process a signal output from the solid-state image sensor, the solid-state image sensor including a pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel having two or more types of sizes for each color, and in the pattern, a color array of a first pixel group including a plurality of first output pixels and a color array of a second pixel group including a plurality of second output pixels, the second output pixel having a different size from the first output pixel, are different, and a second signal processing unit configured to perform synthesis processing for a plurality of the pixel signals from a plurality of the output pixels having a same color and different sizes.

In the first aspect of the present technology, the synthesis processing for a plurality of the pixel signals from a plurality of the output pixels having a same color and different sizes, of the pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel of at least one color among the output pixels having three or more types of sizes, is performed.

In the second aspect of the present technology, the synthesis processing for a plurality of the pixel signals from a plurality of the output pixels having a same color and different sizes, of the pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel of at least one color among the output pixels having three or more types of sizes, is performed, and processing for a signal after the synthesis processing is performed.

According to the third aspect of the present technology, the synthesis processing for a plurality of the pixel signals from a plurality of the output pixels having a same color and different sizes, of the pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel having two or more types of sizes for each color, and in the pattern, a color array of a first pixel group including a plurality of first output pixels and a color array of a second pixel group including a plurality of second output pixels, the second output pixel having a different size from the first output pixel, are different, is performed.

According to the fourth aspect of the present technology, the synthesis processing for a plurality of the pixel signals from a plurality of the output pixels having a same color and different sizes, of the pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel having two or more types of sizes for each color, and in the pattern, a color array of a first pixel group including a plurality of first output pixels and a color array of a second pixel group including a plurality of second output pixels, the second output pixel having a different size from the first output pixel, are different, is performed, and processing for a signal after the synthesis processing is performed.

Effect of the Invention

According to the first to fourth aspects of the present technology, the dynamic range can be expanded while the degradation of image quality can be suppressed.

Note that effects described in the present specification are merely examples, and effects of the present technology are not limited to the effects described in the specification, and there may be additional effects.

MODE FOR CARRYING OUT THE INVENTION

Hereinafter, a mode for implementing the present technology (hereinafter referred to as embodiment) will be described. Note that the description will be given in the following order.

1. Embodiment
2. Modification
3. Use example of solid-state image sensor

1. Embodiment

Basic System Configuration

Figure 1:
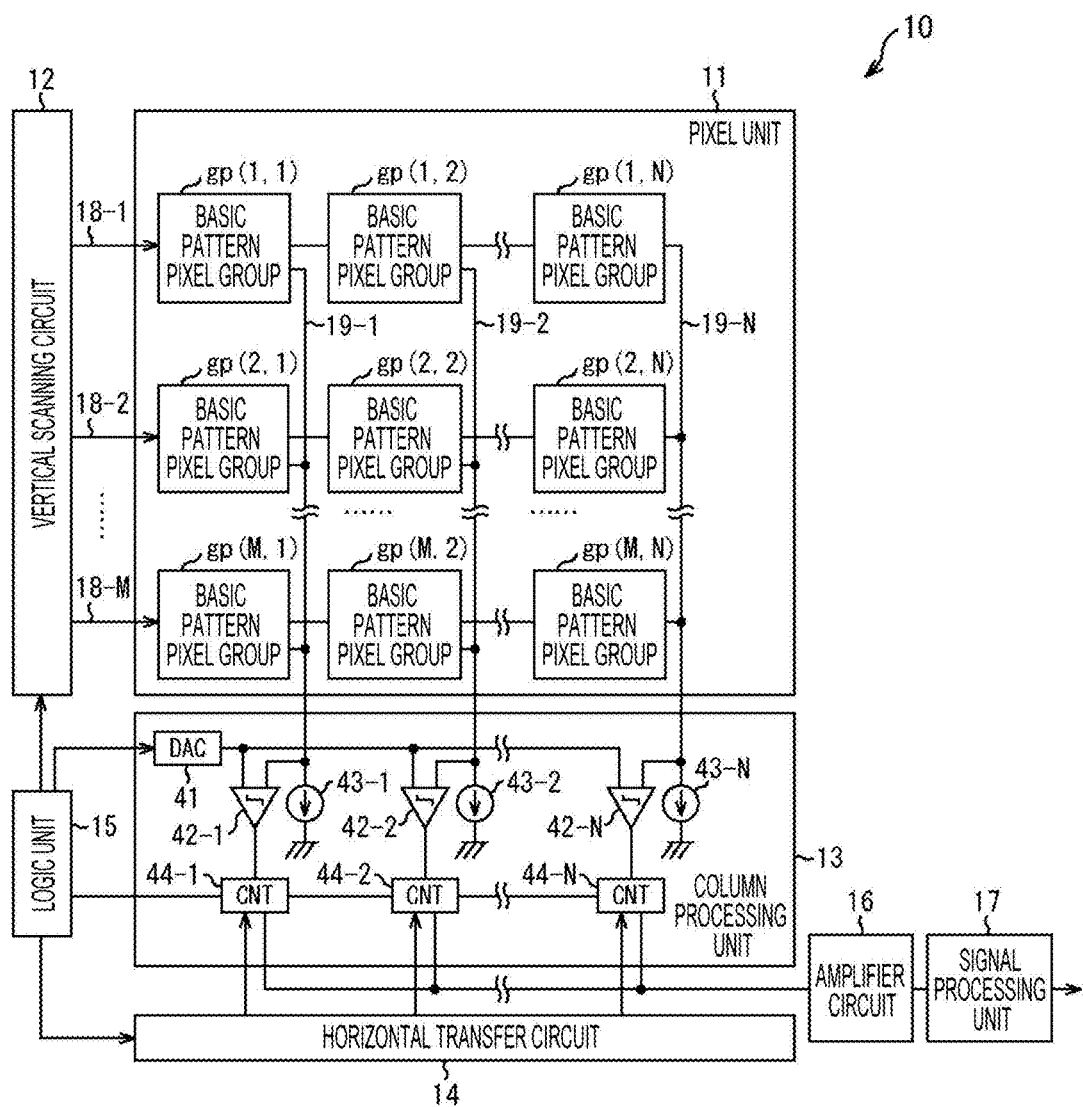
FIG. 1 is a block diagram illustrating a configuration example of a solid-state image sensor to which the present technology is applied.

FIG. 1 is a block diagram illustrating an embodiment of a solid-state image sensor to which the present technology is applied. A solid-state image sensor 10 illustrated in FIG. 1 is configured from a CMOS image sensor that is one type of X-Y address-type solid-state image sensor, for example.

The solid-state image sensor 10 includes a pixel unit 11, a vertical scanning circuit 12, a column processing unit 13, a horizontal transfer circuit 14, a logic unit 15, an amplifier circuit 16, and a signal processing unit 17.

In the pixel unit 11, basic pattern pixel groups gp are arranged in a two-dimensional manner (M rows×N columns). Here, the basic pattern pixel group gp is a pixel group that forms a basic pattern illustrated in FIG. 2 and the like. Further, in the pixel unit 11, pixel drive lines 18-1 to 18-M as row signal lines are wired along a row direction for each row (hereinafter referred to as basic pattern row) based on the basic pattern pixel group gp. Further, in the pixel unit 11, vertical signal lines 19-1 to 19-N as column signal lines are wired along a column direction for each column (hereinafter referred to as basic pattern column) based on the basic pattern pixel group gp.

Note that, hereinafter, the basic pattern row and the basic pattern column may be simply referred to as row and column, respectively. Further, hereinafter, in a case where the basic pattern pixel groups gp need to be individually distinguished, coordinates of the basic pattern pixel groups gp are presented for differentiation, like a basic pattern pixel group gp (m, n).

The pixel drive lines 18-1 to 18-M transmit drive signals for reading pixel signals of the basic pattern pixel groups gp. Note that, in FIG. 1, the pixel drive lines 18-1 to 18-M are illustrated as one line. However, in reality, the pixel drive lines 18-1 to 18-M are configured from a plurality of lines.

Note that, hereinafter, in a case where the pixel drive lines 18-1 to 18-M and the vertical signal lines 19-1 to 19-N do not need to be individually distinguished, they are simply referred to as pixel drive line 18 and vertical signal line 19, respectively.

Figure 2:
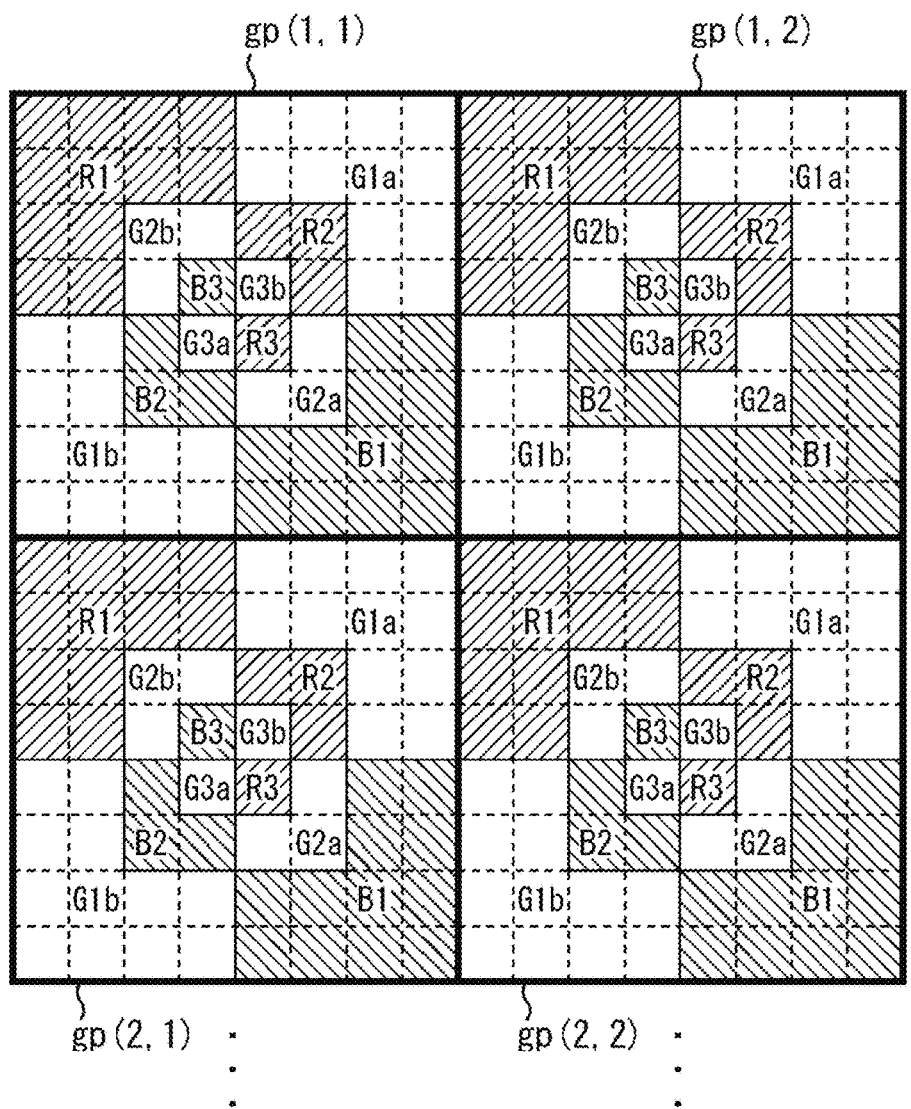
FIG. 2 is a diagram illustrating a configuration example of a basic pattern pixel group.

Here, a configuration example of the basic pattern pixel group gp will be described with reference to FIG. 2. Note that FIG. 2 illustrates basic pattern pixel groups gp (1, 1) to gp (2, 2).

In the basic pattern pixel group gp, output pixels having a plurality of sizes are arranged according to a predetermined basic pattern.

Here, the output pixel is a pixel based on an output unit of the pixel signal. To be specific, the output pixel is a pixel of a case where pixels are divided on the basis of the unit for outputting the pixel signal from the pixel unit 11 to the column processing unit 13. Therefore, each output pixel individually outputs the pixel signal, and the output pixel signal is supplied from the pixel unit 11 to the column processing unit 13.

Further, the output pixel is configured from one or more unit pixels. Here, the unit pixel is a pixel of a case where pixels are divided on the basis of light-receiving elements (for example, photodiodes). Therefore, each unit pixel includes one light-receiving element.

FIG. 2 illustrates an example in which each basic pattern pixel group gp includes output pixels R1 to R3, output pixels G1a to G3a, output pixels G1b to G3b, and output pixels B1 to B3. The output pixels R1 to R3 are provided with red (R) color filters to detect components of wavelength bands in the vicinity of red contained in incident light. The output pixels G1a to G3a and the output pixels G1b to G3b are provided with green (G) color filters to detect components of wavelength bands in the vicinity of green contained in the incident light. The output pixels B1 to B3 are provided with blue (B) color filters to detect components of wavelength bands in the vicinity of blue contained in the incident light.

Further, a cell sectioned by the dotted lines in FIG. 2 indicates a minimum pixel unit. The minimum pixel unit is a smallest unit that can configure the unit pixel. For example, one light-receiving element having the same size may be provided in each minimum pixel unit, or one light-receiving element may be provided in a plurality of the minimum pixel units.

For example, in the case where one light-receiving element having the same size is provided in each minimum pixel unit, the light-receiving area of the unit pixel is nearly equal to the minimum pixel unit. In this case, for example, in the example of FIG. 2, the output pixel R1 is configured from twelve unit pixels, the output pixel R2 is configured from three unit pixels, the smallest output pixel R3 is configured from one unit pixel.

Further, for example, each output pixel may be configured from one unit pixel. In this case, for example, in the example of FIG. 2, the light-receiving area of the unit pixel that configures the output pixel R1 is nearly equal to the twelve minimum pixel units. The light-receiving area of the unit pixel that configures the output pixel R2 is nearly equal to the three minimum pixel units. The light-receiving area of the unit pixel that configures the output pixel R3 is nearly equal to the one minimum pixel unit.

Note that, hereinafter, a pixel group including output pixels of the same color included in the basic pattern pixel group gp is referred to as same color pixel group. For example, the basic pattern pixel group gp in FIG. 2 includes the same color pixel group including the output pixels R1 to R3, the same color pixel group including the output pixels G1a to G3a, the same color pixel group including the output pixels G1b to G3b, and the same color pixel group including the output pixels B1 To B3. Note that the same color pixel group including the output pixels G1a to G3a and the same color pixel group including the output pixels G1b to G3b are pixel groups of the same color, but are divided into two groups according to the processing units.

Figure 3:
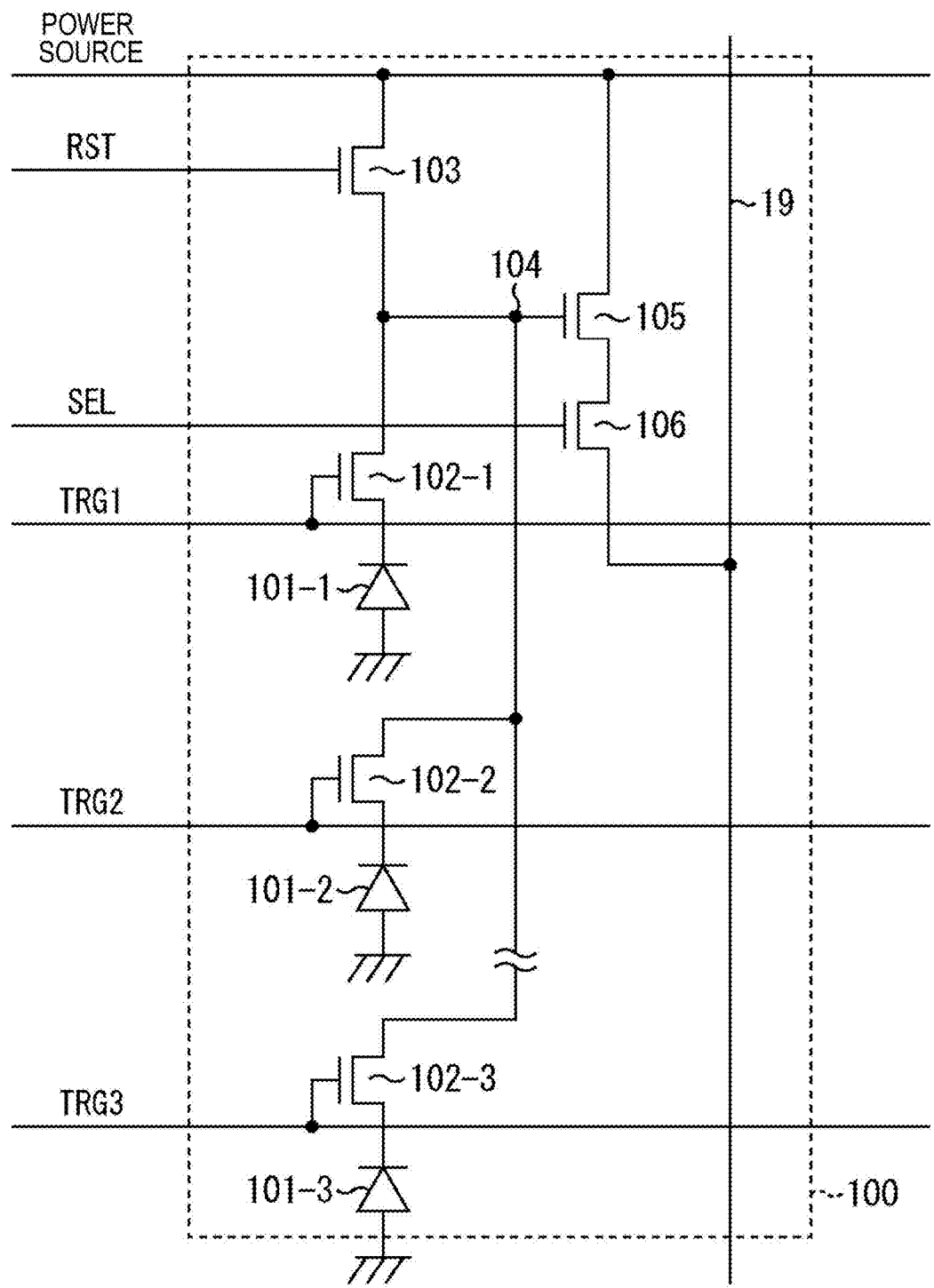
FIG. 3 is a circuit diagram illustrating a configuration example of a same color pixel group.

FIG. 3 illustrates a configuration example of circuits that configure the same color pixel group of the basic pattern pixel group gp in FIG. 2. This example illustrates a case in which each output pixel included in the same color pixel group includes a photodiode as one light-receiving element. That is, FIG. 3 illustrates an example in which each output pixel included in the same color pixel group is configured from one unit pixel.

A same color pixel group 100 of FIG. 3 includes six transistors for three photodiodes 101-1 to 101-3 as active elements, the six transistors being transfer transistors 102-1 to 102-3 as three transfer elements, a reset transistor 103 as one reset element, one amplification transistor 105, and one selection transistor 106. In addition, the same color pixel group 100 has a shared pixel structure in which the three sets of photodiodes and transfer transistors share one floating diffusion (FD) 104, the amplification transistor 105, and the selection transistor 106.

For example, in a case where the same color pixel group 100 is applied to the same color pixel group including the output pixels R1 to R3 in FIG. 2, the output pixel R1 includes the photodiode 101-1 and the transfer transistor 102-1, the output pixel R2 includes the photodiode 101-2 and the transfer transistor 102-2, and the output pixel R3 includes the photodiode 101-3 and the transfer transistor 102-3. Further, the FD 104, the amplification transistor 105, and the selection transistor 106 are shared by the output pixels R1 to R3.

The photodiodes 101-1 to 101-3 perform photoelectric conversion for the incident light into charges of amounts corresponding to respective light amounts. For example, in the case where the photodiodes 101-1 to 101-3 are respectively included in the output pixels R1 to R3, the light-receiving area of the photodiode 101-1 is the largest, the light-receiving area of the photodiode 101-2 is the second largest, and the light-receiving area of the diode 101-3 is the smallest.

The transfer transistors 102-1 to 102-3 are respectively connected between the photodiodes 101-1 to 101-3 and the FD 104 as an output node.

The transfer transistor 102-1 is turned on when a transfer signal TRG1 is given to a gate from the vertical scanning circuit 12 through a transfer control line (when the transfer signal TRG1 is turned on). When the transfer transistor 102-1 is turned on, electrons photoelectrically converted in the photodiode 101-1 are transferred to the FD 104 through the transfer transistor 102-1.

The transfer transistor 102-2 is turned on when a transfer signal TRG2 is given to a gate from the vertical scanning circuit 12 through a transfer control line (when the transfer signal TRG2 is turned on). When the transfer transistor 102-2 is turned on, electrons photoelectrically converted in the photodiode 101-2 are transferred to the FD 104 through the transfer transistor 102-2.

The transfer transistor 102-3 is turned on when a transfer signal TRG3 is given to a gate from the vertical scanning circuit 12 through a transfer control line (when the transfer signal TRG3 is turned on). When the transfer transistor 102-3 is turned on, electrons photoelectrically converted in the photodiode 101-3 are transferred to the FD 104 through the transfer transistor 102-3.

The reset transistor 103 is connected between a power supply line and the FD 104. The reset transistor 103 is turned on when a reset signal RST is given to a gate from the vertical scanning circuit 12 through a reset control line (when the reset signal RST is turned on). When the reset transistor 103 is turned on, a potential of the FD 104 is reset to a potential of the power supply line.

The FD 104 is connected to a gate of the amplification transistor 105. The amplification transistor 105 is connected to the vertical signal line 19 through the selection transistor 106, and configures a current source circuit together with a current source 43 outside the pixel unit 11. The selection transistor 106 is turned on when a control signal SEL is given to a gate from the vertical scanning circuit 12 through a selection control line (when the control signal SEL is turned on). When the selection transistor 106 is turned on, the amplification transistor 105 amplifies the potential of the FD 104 and outputs a pixel signal corresponding to the potential to the vertical signal line 19. The pixel signals output from the same color pixel groups 100 are supplied to the column processing unit 13 as a pixel signal reading unit through the vertical signal line 19.

These operations are performed at the same time for the same color pixel groups 100 of the same color, of the basic pattern pixel groups gp of one row, when the gates of the transfer transistors 102-1 to 102-3, the reset transistor 103, and the selection transistor 106 are connected in row units, for example.

Note that the transfer transistors 102-1 to 102-3 are individually turned on. For example, in a case where the same color pixel group 100 is applied to the same color pixel group including the output pixels R1 to R3 in FIG. 2 and the output pixels R1 to R3 respectively include the photodiodes 101-1 to 101-3, the pixel signal of the output pixel R1 corresponding to the light amount received by the photodiode 101-1 is output to the vertical signal line 19 when the transfer transistor 102-1 is turned on. The pixel signal of the output pixel R2 corresponding to the light amount received by the photodiode 101-2 is output to the vertical signal line 19 when the transfer transistor 102-2 is turned on. The pixel signal of the output pixel R3 corresponding to the light amount received by the photodiode 101-3 is output to the vertical signal line 19 when the transfer transistor 102-3 is turned on.

Further, the pixel drive line 18 for the same color pixel group 100 in FIG. 3 includes the three transfer control lines, the reset control line, and the selection control line. For example, in the case where the same color pixel group 100 in FIG. 3 is applied to the basic pattern pixel group gp in FIG. 2, one basic pattern pixel group gp includes four same color pixel groups 100. Therefore, in this case, the pixel drive line 18 of one row includes, for example, twelve transfer control lines, four reset control lines, and four selection control lines.

Note that the circuit configuration in FIG. 3 is an example, and another circuit configuration can be employed.

For example, FIG. 3 illustrates an example in which the same color pixel group included in the basic pattern pixel group is configured from one shared pixel. However, the output pixels included in the same color pixel group may be respectively configured from independent pixels.

Further, FIG. 3 illustrates an example in which each output pixel includes one photodiode, for example. However, one output pixel may be provided with a plurality of photodiodes. For example, as described above, in the case where one light-receiving element having the same size is provided in each minimum pixel unit, a plurality of photodiodes is provided in the output pixels R1 and R2, and the like in FIG. 2.

Note that, in the case where one light-receiving element having the same size is provided in each minimum pixel unit, for example, the configuration of the basic pattern can be freely changed after the wiring process of the solid-state image sensor 10. For example, the number, the sizes, and the positions of the output pixels of each color in the basic pattern can be freely changed by change of the wiring between the unit pixels and the arrangement of the color filters. In this case, each output pixel is formed by a combination of the unit pixels with wiring.

Referring back to FIG. 1, the vertical scanning circuit 12 is configured from, for example, a shift register, an address decoder, and the like, and drives the basic pattern pixel groups gp of the pixel unit 11 in basic pattern row units or the like. That is, the vertical scanning circuit 12 configures a driving unit that controls operations of the basic pattern pixel groups gp of the pixel unit 11 together with the logic unit 15 that controls the vertical scanning circuit 12.

The pixel signals output from the basic pattern pixel groups gp of the basic pattern row selected and scanned by the vertical scanning circuit 12 are input to the column processing unit 13 through the vertical signal line 19 for each basic pattern column.

The column processing unit 13 performs predetermined signal processing for the pixel signal supplied from each basic pattern pixel group gp of the selected basic pattern row through the vertical signal line 19, for each basic pattern column of the pixel unit 11, and temporarily holds the pixel signal after the signal processing.

To be specific, the column processing unit 13 includes a DA conversion circuit (DAC) 41, comparators 42-1 to 42-N, current sources 43-1 to 43-N, and counters (CNT) 44-1 to 44-N. Further, a unit circuit including the comparator 42-$i$, the current source 43-$i$, and the counter 44-$i$ ($i$=1 to N) is configured for each basic pattern column.

Note that, hereinafter, in a case where the comparators 42-1 to 42-N, the current sources 43-1 to 43-N, and the counters 44-1 to 44-N do not need to be individually distinguished, they are simply referred to as comparator 42, current source 43, and counter 44, respectively.

The comparator 42 compares a reference voltage (ramp wave) generated by the DAC 41 and the pixel signal supplied through the vertical signal line 19 and supplies an output signal that indicates a comparison result to the counter 44.

The counter 44 counts the time from when the comparator 42 starts the comparison processing to when the output signal of the comparator 42 is inverted. Then, a digital pixel signal that indicates a count result of the counter 44 is supplied to the amplifier circuit 16 by the horizontal transfer circuit 14.

In this manner, the column processing unit 13 performs A/D conversion of the pixel signal. Note that the column processing unit 13 may perform noise removal processing, correlated double sampling (CDS) processing, double data sampling (DDS) processing, and the like, in addition to A/D conversion processing.

The horizontal transfer circuit 14 is configured from a shift register, an address decoder, and the like, and sequentially selects the unit circuits corresponding to the basic pattern column of the column processing unit 13. By the selective scanning by the horizontal transfer circuit 14, the pixel signals processed in the column processing unit 13 for each unit circuit are sequentially output.

The logic unit 15 is configured from a timing generator that generates various timing signals, and the like, and drives and controls the vertical scanning circuit 12, the column processing unit 13, the horizontal transfer circuit 14, and the like, on the basis of various types of timing generated by the timing generator.

The amplifier circuit 16 amplifies the pixel signals supplied from the counters 44 and supplies the amplified signals to the signal processing unit 17.

The signal processing unit 17 performs various types of signal processing for the pixel signals supplied from the amplifier circuit 16 to generate image data. Note that the signal processing performed by the signal processing unit 17 includes synthesis processing of the pixel signals of the output pixels in the same color pixel group, as described below. Then, the signal processing unit 17 outputs the generated image data.

Examples of Basic Pattern

Hereinafter, examples of arrangement of output pixels (that is, the basic pattern) of the basic pattern pixel group gp of the pixel unit 11 will be described with reference to FIGS. 4 to 25.

Note that, in FIGS. 4 to 21, the output pixels having a large light-receiving area (hereinafter, also referred to as large pixels) are represented by reference signs R1, G1$a$, G1$b$, B1, and C1$a$ to C1$c$. The output pixels having a medium light-receiving area (hereinafter, also referred to as middle pixels) are represented by reference signs R2, G2$a$, G2$b$, B2, and C2$a$ to C2$c$. The output pixels having a small light-receiving area (hereinafter, also referred to as small pixels) are represented by reference signs R3, G3$a$, G3$b$, B3, and C3$a$ to C3$c$.

Figure 4:
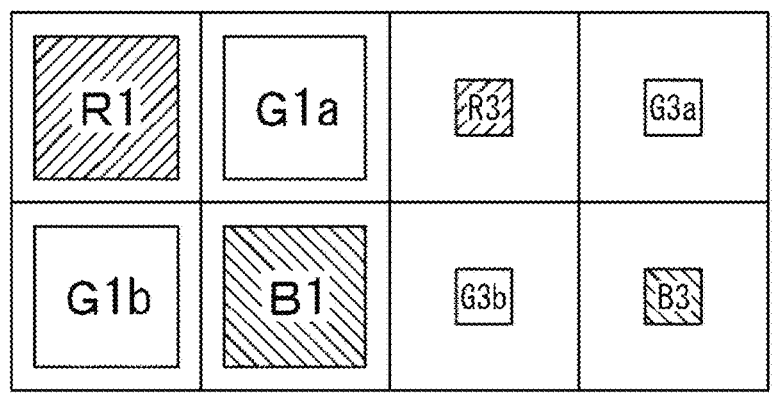
FIG. 4 is a diagram illustrating a first example of a basic pattern.
Figure 5:
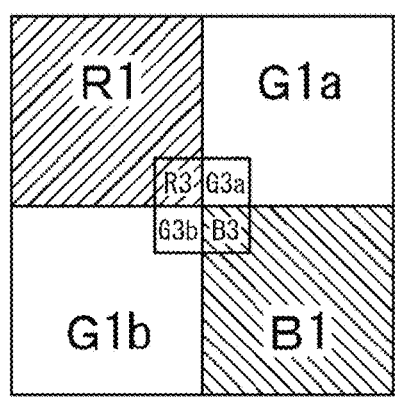
FIG. 5 is a diagram illustrating a second example of the basic pattern.
Figure 6:
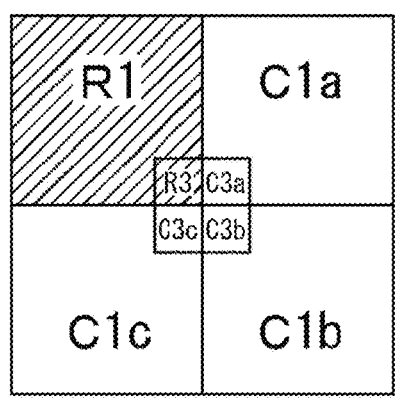
FIG. 6 is a diagram illustrating a third example of the basic pattern.
Figure 9:
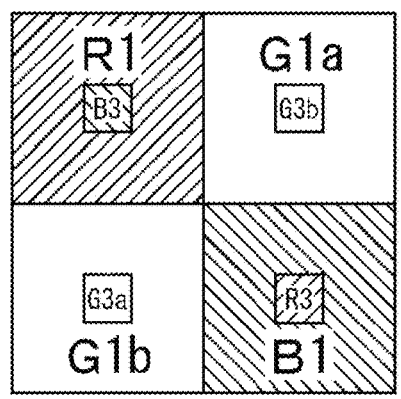
FIG. 9 is a diagram illustrating a sixth example of the basic pattern.
Figure 10:
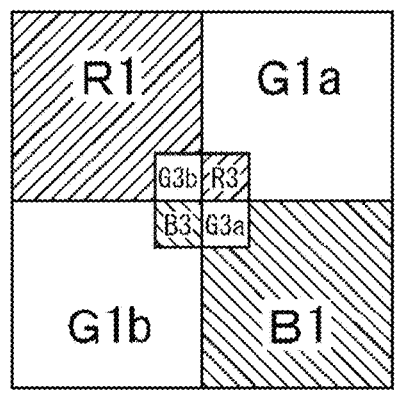
FIG. 10 is a diagram illustrating a seventh example of the basic pattern.
Figure 11:
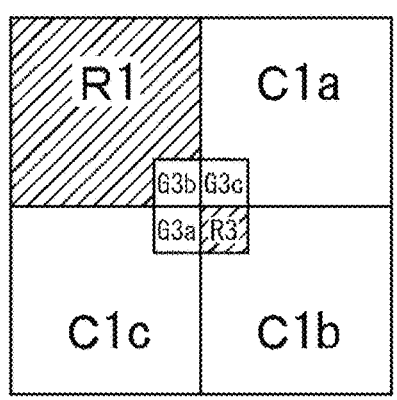
FIG. 11 is a diagram illustrating an eighth example of the basic pattern.

FIGS. 4 to 11 illustrate examples of the basic pattern in which two types of output pixels: large pixels and small pixels are arranged for each color. Further, FIGS. 4 and 5 and FIGS. 7 to 10 illustrate examples in which the output pixels are configured from three colors: red (R), green (G), and blue (B), and FIGS. 6 and 11 illustrate examples in which the output pixels are configured from two colors: red (R) and clear (C). Note that the clear pixel is a pixel provided with no color filter or a transparent color filter, and is a pixel similar to so-called a white (W) pixel. For example, this RCCC color system is used to improve detection accuracy of light in a red wavelength band (for example, a brake lamp or the like), which is important in in-vehicle sensing and the like.

In the basic pattern illustrated in FIG. 4, a large pixel group in which the large pixel R1, the large pixel G1$a$, the large pixel G1$b$, and the large pixel B1 are arranged according to the Bayer array, and a small pixel group in which a small pixel R3, the small pixel G3$a$, the small pixel G3$b$, and the small pixel B3 are arranged according to the Bayer array are arranged side by side. Note that, for example, the large pixel group and the small pixel group may be arranged one above the other.

In the basic pattern illustrated in FIG. 5, a small pixel group including the small pixel R3, the small pixel G3a, the small pixel G3b, and the small pixel B3 is arranged according to the Bayer array. Further, a large pixel group including the large pixel R1, the large pixel G1a, the large pixel G1b, and the large pixel B1 is arranged to surround a periphery of the small pixel group according to the Bayer array. That is, in this basic pattern, the large pixel group surrounds the periphery of the small pixel group, and the color array of the large pixel group and the color array of the small pixel group are the same.

In the basic pattern of FIG. 6, a small pixel group including the small pixel R3, the small pixel C3a, the small pixel C3b, and the small pixel C3c is arranged in a 2 rows×2 columns manner. To be specific, the small pixel C3a is arranged on the right of the small pixel R3, the small pixel C3c is arranged under the small pixel R3, and the small pixel C3b is arranged diagonally to the lower right of the small pixel R3. Further, a large pixel group including the large pixel R1, the large pixel C1a, the large pixel C1b, and the large pixel C1c is arranged to surround a periphery of the small pixel group according to a similar color array to the small pixel group. That is, in this basic pattern, the large pixel group surrounds the periphery of the small pixel group, and the color array of the large pixel group and the color array of the small pixel group are the same.

Figure 7:
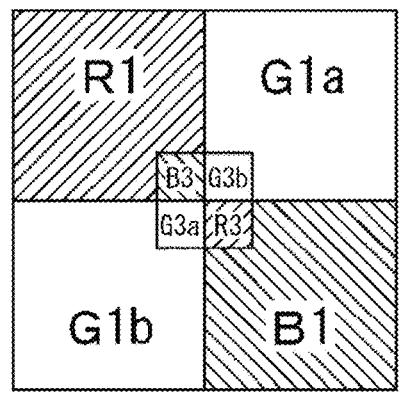
FIG. 7 is a diagram illustrating a fourth example of a basic pattern.

In the basic pattern of FIG. 7, a small pixel group including the small pixel R3, the small pixel G3a, the small pixel G3b and the small pixel B3 is arranged according to the Bayer array. Further, a large pixel group including the large pixel R1, the large pixel G1a, the large pixel G1b, and the large pixel B1 is arranged to surround a periphery of the small pixel group according to the Bayer array. Note that the color array of the large pixel group is a 180-degree rotated array of the color array of the small pixel group. That is, in this basic pattern, the large pixel group surrounds the periphery of the small pixel group, and the color array of the large pixel group and the color array of the small pixel group are different.

Figure 8:
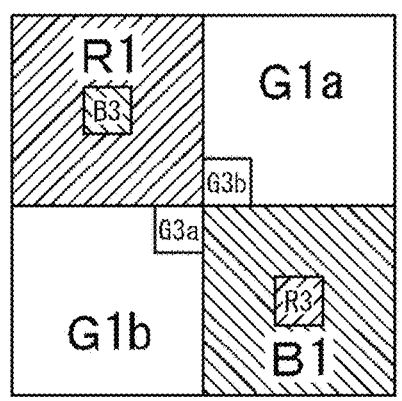
FIG. 8 is a diagram illustrating a fifth example of the basic pattern.

The basic pattern of FIG. 8 is different from the basic pattern of FIG. 7 in positions of the small pixel R3 and the small pixel B3. That is, the small pixel R3 is arranged at a center of the large pixel B1, and the large pixel B1 surrounds a periphery of the small pixel R3. Further, the small pixel B3 is arranged at a center of the large pixel R1, and the large pixel R1 surrounds a periphery of the small pixel B3. That is, in this basic pattern, the small pixel group is arranged in the large pixel group, and the color array of the large pixel group and the color array of the small pixel group are different. Further, the arrangement of small pixel group is asymmetric in a left and right direction and in an up and down direction.

In the basic pattern of FIG. 9, a large pixel group including the large pixel R1, the large pixel G1a, the large pixel G1b, and the large pixel B1 is arranged according to the Bayer array. Further, a small pixel group including the small pixel R3, the small pixel G3a, the small pixel G3b, and the small pixel B3 is arranged according to the Bayer array. Note that the color array of the small pixel group is a 180-degree rotated array of the color array of the large pixel group. Further, the small pixel R3 is arranged at a center of the large pixel B1, and the large pixel B1 surrounds a periphery of the small pixel R3. The small pixel G3a is arranged at a center of the large pixel G1b, and the large pixel G1b surrounds a periphery of the small pixel G3a. The small pixel G3b is arranged at a center of the large pixel G1a, and the large pixel G1a surrounds a periphery of the small pixel G3b. The small pixel B3 is arranged at a center of the large pixel R1, and the large pixel R1 surrounds a periphery of the small pixel B3. That is, in this basic pattern, the small pixel group is arranged in the large pixel group, and the color array of the large pixel group and the color array of the small pixel group are different. In addition, the small pixels are arranged at substantially the centers of the large pixels.

The basic pattern of FIG. 10 is different from the basic pattern of FIG. 7 in arrangement of a small pixel group. That is, in the basic pattern of FIG. 10, the color array of the small pixel group is rotated counterclockwise by 90 degrees, as compared with the basic pattern of FIG. 7.

The basic pattern of FIG. 11 is different from the basic pattern of FIG. 6 in arrangement of a small pixel group. That is, in the basic pattern of FIG. 11, the color array of the small pixel group is rotated by 180 degrees, as compared with the basic pattern of FIG. 6. Therefore, in this basic pattern, the large pixel group surrounds a periphery of the small pixel group, and the color array of the large pixel group and the color array of the small pixel group are different.

FIGS. 12 to 16 illustrate examples of the basic pattern of a case where green output pixels are configured from three types of pixels: large pixels, middle pixels, and small pixels, and red and blue pixels are configured from two types of pixels: large pixels and small pixels.

Figure 12:
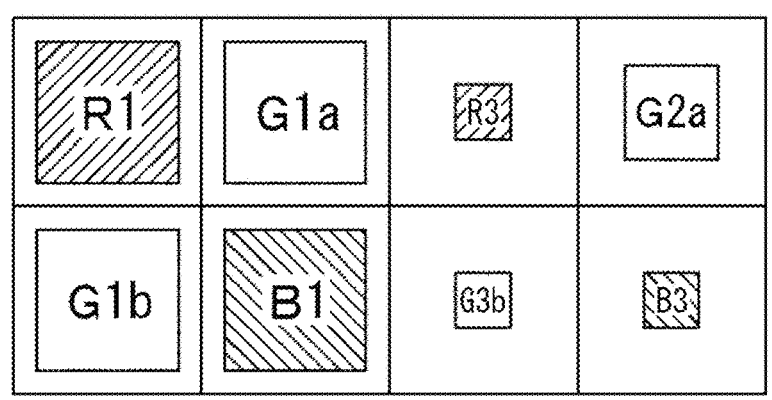
FIG. 12 is a diagram illustrating a ninth example of the basic pattern.

The basic pattern of FIG. 12 is a pattern obtained by replacing the small pixel G3a of the basic pattern of FIG. 4 with the middle pixel G2a.

Figure 13:
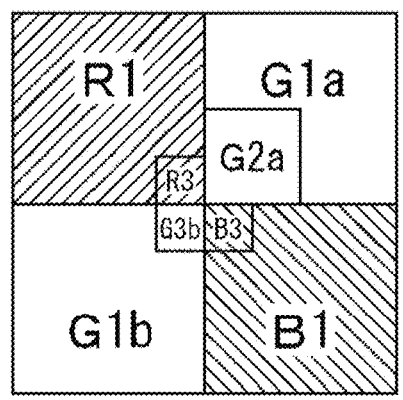
FIG. 13 is a diagram illustrating a tenth example of the basic pattern.

The basic pattern of FIG. 13 is a pattern obtained by replacing the small pixel G3a of the basic pattern of FIG. 5 with the middle pixel G2a.

Figure 14:
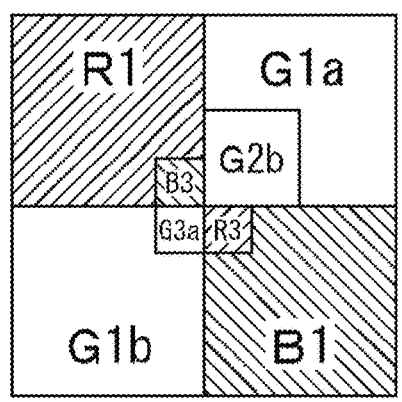
FIG. 14 is a diagram illustrating an eleventh example of the basic pattern.

The basic pattern of FIG. 14 is a pattern obtained by replacing the small pixel G3b of the basic pattern of FIG. 7 with the middle pixel G2b.

Figure 15:
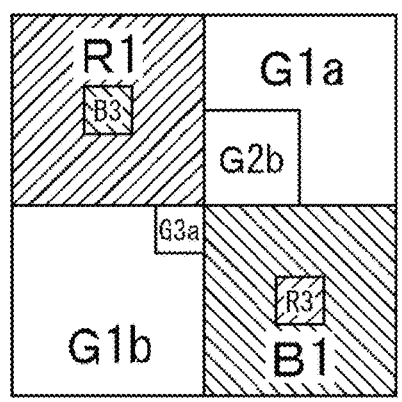
FIG. 15 is a diagram illustrating a twelfth example of the basic pattern.

The basic pattern of FIG. 15 is a pattern obtained by replacing the small pixel G3b of the basic pattern of FIG. 8 with the middle pixel G2b.

Figure 16:
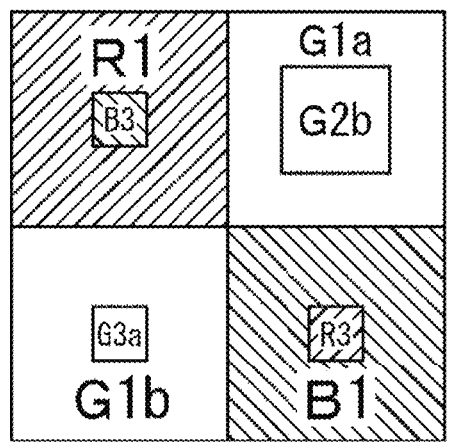
FIG. 16 is a diagram illustrating a thirteenth example of the basic pattern.

The basic pattern of FIG. 16 is a pattern obtained by replacing the small pixel G3b of the basic pattern of FIG. 9 with the middle pixel G2b.

In this manner, the basic patterns of FIGS. 12 to 16 are configured from a large pixel group including the large pixels and a pixel group having an irregular size including the middle pixels and the small pixels, and the pixel groups are in accordance with color arrays similar to the color arrays in FIGS. 4 and 5 and FIGS. 7 to 9.

Figure 17:
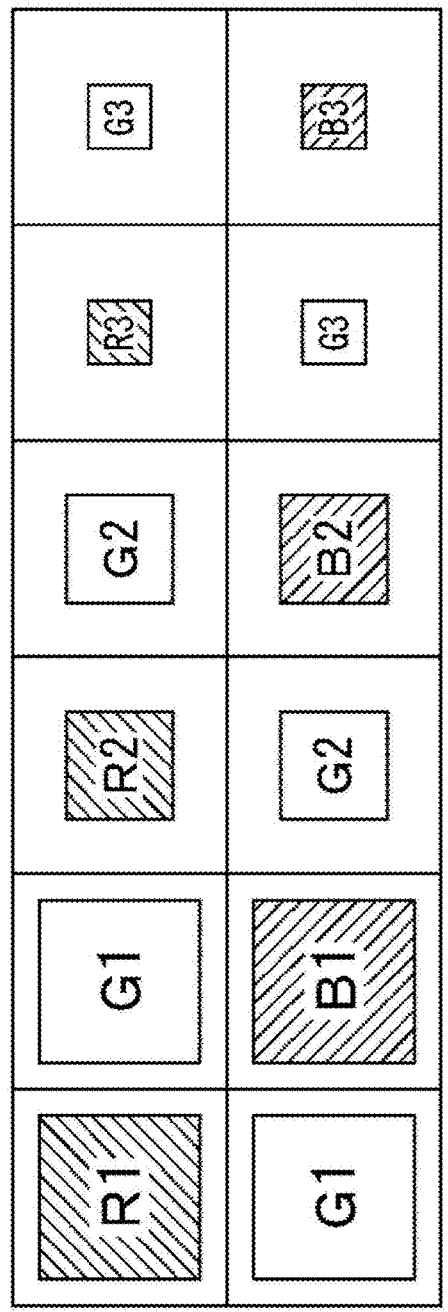
FIG. 17 is a diagram illustrating a fourteenth example of the basic pattern.
Figure 18:
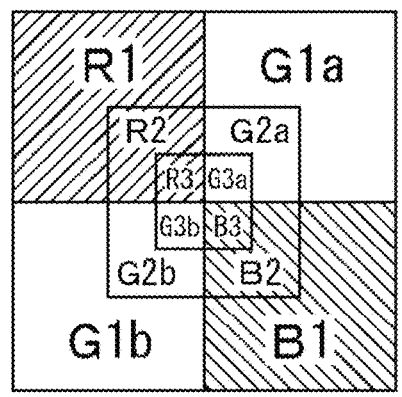
FIG. 18 is a diagram illustrating a fifteenth example of the basic pattern.
Figure 19:
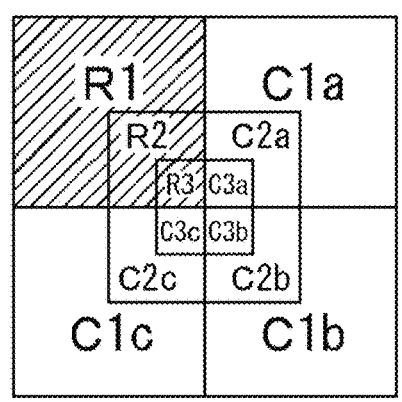
FIG. 19 is a diagram illustrating a sixteenth example of the basic pattern.
Figure 20:
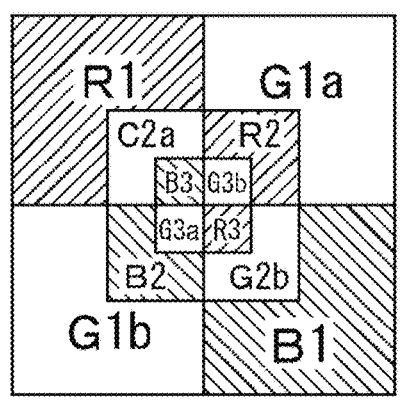
FIG. 20 is a diagram illustrating a seventeenth example of the basic pattern.
Figure 21:
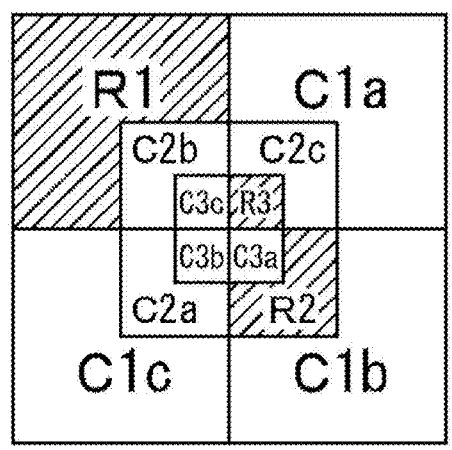
FIG. 21 is a diagram illustrating an eighteenth example of the basic pattern.

FIGS. 17 to 21 illustrate examples of the basic pattern in which output pixels of each color are configured from three types pixels: large pixels, middle pixels, and small pixels. In addition, FIGS. 17, 18, and 20 illustrate examples in which output pixels are configured from three colors: red (R), green (G), and blue (B), and FIGS. 19 and 21 illustrate examples in which output pixels are configured from two colors: red (R) and clear (C).

In the basic pattern of FIG. 17, a large pixel group in which the large pixel R1, the large pixel G1a, the large pixel G1b, and the large pixel B1 are arranged according to the Bayer array, a middle pixel group in which the middle pixel R2, the middle pixel G2a, the middle pixel G2b, and middle pixel B2 are arranged according to the Bayer array, and a small pixel group in which the small pixel R3, the small pixel G3a, the small pixel G3b, and the small pixel B3 are arranged according to the Bayer array are arranged side by side. Note that, for example, the large pixel group, the middle pixel group, and the small pixel group may be arranged one above another.

In the basic pattern of FIG. 18, a small pixel group including the small pixel R3, the small pixel G3a, the small pixel G3b, and the small pixel B3 is arranged according to the Bayer array. In addition, a middle pixel group including the middle pixel R2, the middle pixel G2a, the middle pixel G2b, and the middle pixel B2 is arranged to surround a periphery of the small pixel group according to the Bayer array. Further, a large pixel group including the large pixel R1, the large pixel G1a, the large pixel G1b, and the large pixel B1 is arranged to surround a periphery of the middle pixel group according to the Bayer array. That is, in this basic pattern, the middle pixel group surrounds the periphery of the small pixel group, the large pixel group surrounds the periphery of the middle pixel group, and the color arrays of the large pixel group, the middle pixel group, and the small pixel group are the same.

In the basic pattern of FIG. 19, a small pixel group including the small pixel R3, the small pixel C3a, the small pixel C3b and the small pixel C3c is arranged according to a color array similar to the basic pattern of FIG. 6. Further, a large pixel group including the middle pixel R2, the middle pixel C2a, the middle pixel C2b, and the middle pixel C2c is arranged to surround a periphery of the small pixel group according to a color array similar to the small pixel group. Further, a large pixel group including the large pixel R1, the large pixel C1a, the large pixel C1b, and the large pixel C1c is arranged to surround a periphery of the middle pixel group according to a color array similar to the middle pixel group and the small pixel group. That is, in this basic pattern, the middle pixel group surrounds the periphery of the small pixel group, the large pixel group surrounds the periphery of the middle pixel group, and the color arrays of the large pixel group, the middle pixel group, and the small pixel group are the same.

In the basic pattern of FIG. 20, a small pixel group including the small pixel R3, the small pixel G3a, the small pixel G3b and the small pixel B3 is arranged according to the Bayer array. In addition, a middle pixel group including the middle pixel R2, the middle pixel G2a, the middle pixel G2b, and the middle pixel B2 is arranged to surround a periphery of the small pixel group according to the Bayer array. Further, a large pixel group including the large pixel R1, the large pixel G1a, the large pixel G1b, and the large pixel B1 is arranged to surround a periphery of the middle pixel group according to the Bayer array. Note that the color array of the middle pixel group is an array obtained by rotating counterclockwise the color array of the small pixel group by 90 degrees. The color array of the large pixel group is an array obtained by rotating counterclockwise the color array of the middle pixel group by 90 degrees. That is, in this basic pattern, the middle pixel group surrounds the periphery of the small pixel group, the large pixel group surrounds the periphery of the middle pixel group, and the color arrays of the large pixel group, the middle pixel group, and the small pixel group are different from one another.

Note that the basic pattern of FIG. 20 is similar to the basic pattern of FIG. 2 described above.

In the example of FIG. 21, a small pixel group including the small pixel R3, the small pixel C3a, the small pixel C3b, and the small pixel C3c is arranged in a 2 rows×2 columns manner. To be specific, the small pixel C3a is arranged under the small pixel R3, the small pixel C3c is arranged on the left of the small pixel R3, and the small pixel C3b is arranged diagonally to the lower left of the small pixel R3. Further, a middle pixel group including the middle pixel R2, the middle pixel C2a, the middle pixel C2b, and the middle pixel C2c is arranged to surround a periphery of the small pixel group. Note that the color array of the middle pixel group is an array obtained by rotating clockwise the color array of the small pixel group by 90 degrees. Further, a large pixel group including the large pixel R1, the large pixel C1a, the large pixel C1b, and the large pixel C1c is arranged to surround a periphery of the middle pixel group. Note that the color array of the large pixel group is an array obtained by rotating the color array of the middle pixel group by 180 degrees. That is, in this basic pattern, the middle pixel group surrounds the periphery of the small pixel group, the large pixel group surrounds the periphery of the middle pixel group, and the color arrays of the large pixel group, the middle pixel group, and the small pixel group are different from one another.

Example of Method of Synthesizing Pixel Signals

Next, an example of a method of synthesizing pixel signals of colors of the basic pattern pixel group gp in the signal processing unit 17 will be described with reference to FIGS. 22 to 25. Here, synthesis of pixel signals is processing of expanding a dynamic range by switching or adding pixel signals of output pixels having different sizes in the same color pixel group of the basic pattern pixel group according to incident light amount.

First, an example of a method of synthesizing two types of pixel signals of a large pixel and a small pixel of the same color will be described with reference to FIGS. 22 and 23.

Figure 22:
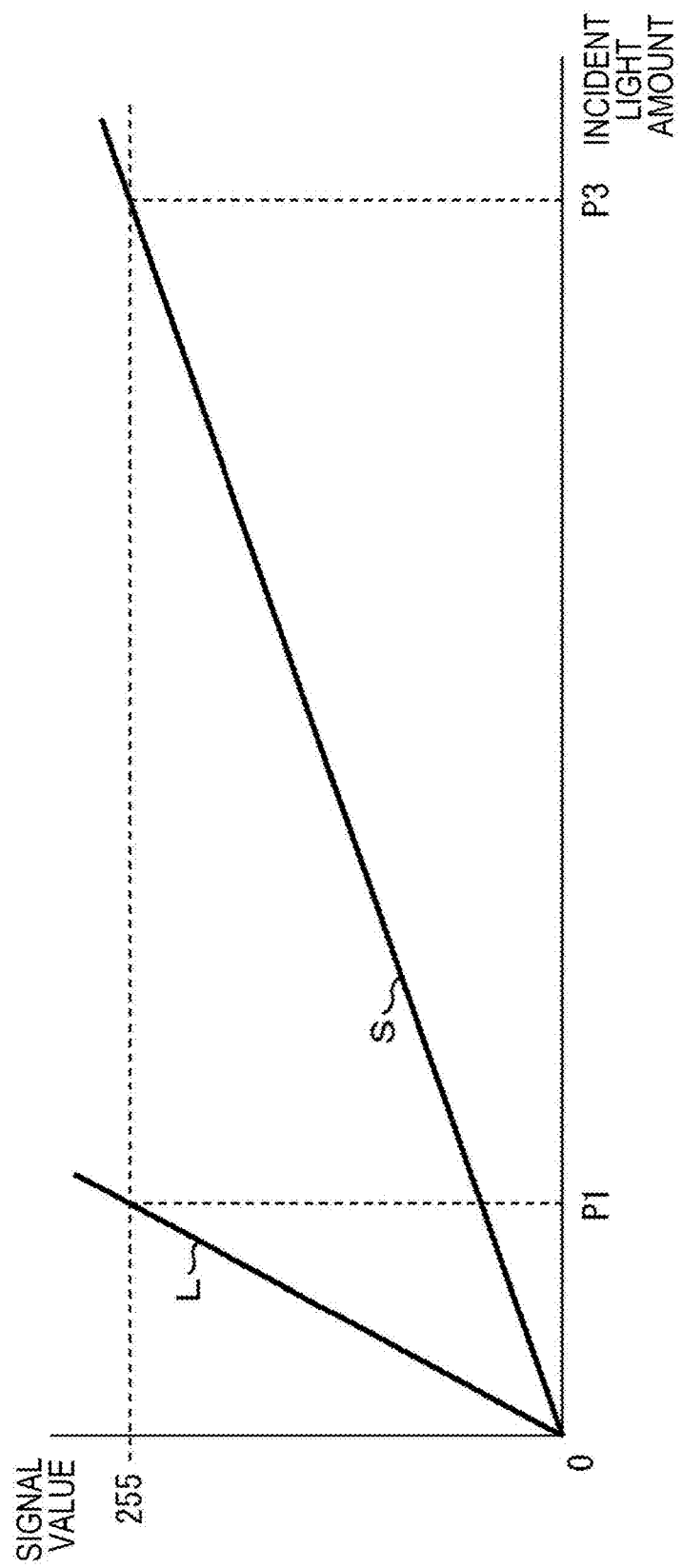
FIG. 22 is a graph schematically illustrating a first example of characteristics of pixel signals.

FIG. 22 is a graph schematically illustrating characteristics of a pixel signal output from the column processing unit 13. The horizontal axis represents an incident light amount and the vertical axis represents a signal value. Note that the signal value on the vertical axis indicates an example of a case where the column processing unit 13 quantizes an analog pixel signal with 8-bit gradation (256 gradations). Further, a characteristic curve L indicates the characteristic of the pixel signal of the large pixel, and a characteristic curve S indicates the characteristic of the pixel signal of the small pixel. Note that, hereinafter, the slope of the characteristic curve L is L, and the slope of the characteristic curve S is S.

As compared with the small pixel, the large pixel has higher sensitivity while having a smaller saturation light amount because of a larger light-receiving area. On the other hand, as compared with the large pixel, the small pixel has lower sensitivity while having a larger saturation light amount because of a smaller light-receiving area. Then, the light amount detectable by the large pixel, that is, the dynamic range of the large pixel is a range from the light 0 to the light amount P1. On the other hand, the light amount detectable by the small pixel, that is, the dynamic range of the small pixel is a range from the light amount 0 to the light amount P3.

Here, the signal processing unit 17 selects the pixel signal of the large pixel in the range from the light amount 0 to the light amount P1, and outputs the selected pixel signal. On the other hand, the signal processing unit 17 selects the pixel signal of the small pixel and outputs a signal obtained by multiplying the selected pixel signal by a predetermined coefficient in the range from the light amount P1 to the light amount P3. This coefficient is set to, for example, L/S, which is approximately equal to the ratio of the size of the large pixel (light-receiving area) to the small pixel.

As a result, the dynamic range is expanded to the range from the light amount 0 to the light amount P3, as compared with a case of using only the large pixel. Further, sensitivity is improved by using the pixel signal of the large pixel having a relatively large light-receiving area, for a dark part of an object (low luminance object). On the other hand, occurrence of white streaks caused by saturation of the photodiode 101 can be prevented by using the pixel signal of the small pixel having a relatively small light-receiving area, for a bright portion of an object (high luminance object).

Figure 23:
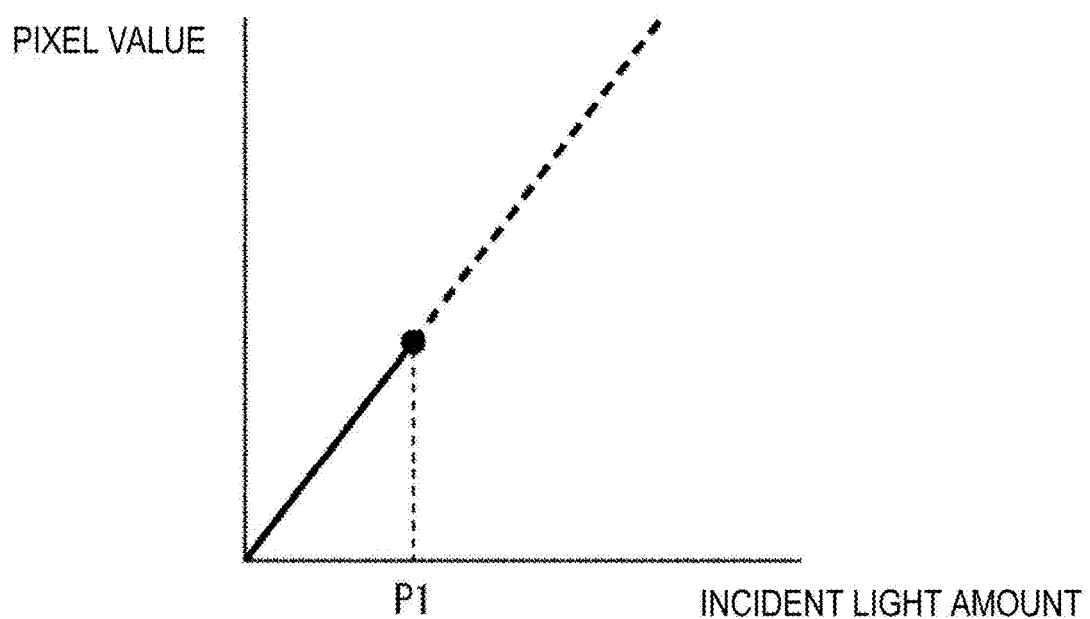
FIG. 23 is a graph schematically illustrating a first example of characteristics of a synthesized signal.

FIG. 23 is a graph schematically illustrating characteristics of a pixel signal (hereinafter referred to as a synthesized signal) output from the signal processing unit 17 in a case where the synthesis processing described above is performed with reference to FIG. 22. The horizontal axis represents an incident light amount and the vertical axis represents a signal value.

Here, the characteristics of the synthesized signal is changed near the incident light amount P1 where switching of the pixel signals occurs. For example, the graph may be discontinuous before and after the incident light amount P1, or the slope of the graph may be changed before and after the incident light amount P1. Due to this characteristic change, there is a possibility of occurrence of a phenomenon in which color or brightness is unnaturally changed in spatial direction and temporal direction near the incident light amount P1. Further, this characteristic change becomes larger as a difference between the characteristic curve L of the large pixel and the characteristic curve S of the small pixel (for example, a difference between the slope of the characteristic curve L and the slope of the characteristic curve S) becomes larger Next, an example of a method of synthesizing three types of pixel signals of a large pixel, a middle pixel, and a small pixel of the same color will be described with reference to with reference to FIGS. 24 and 25.

Figure 24:
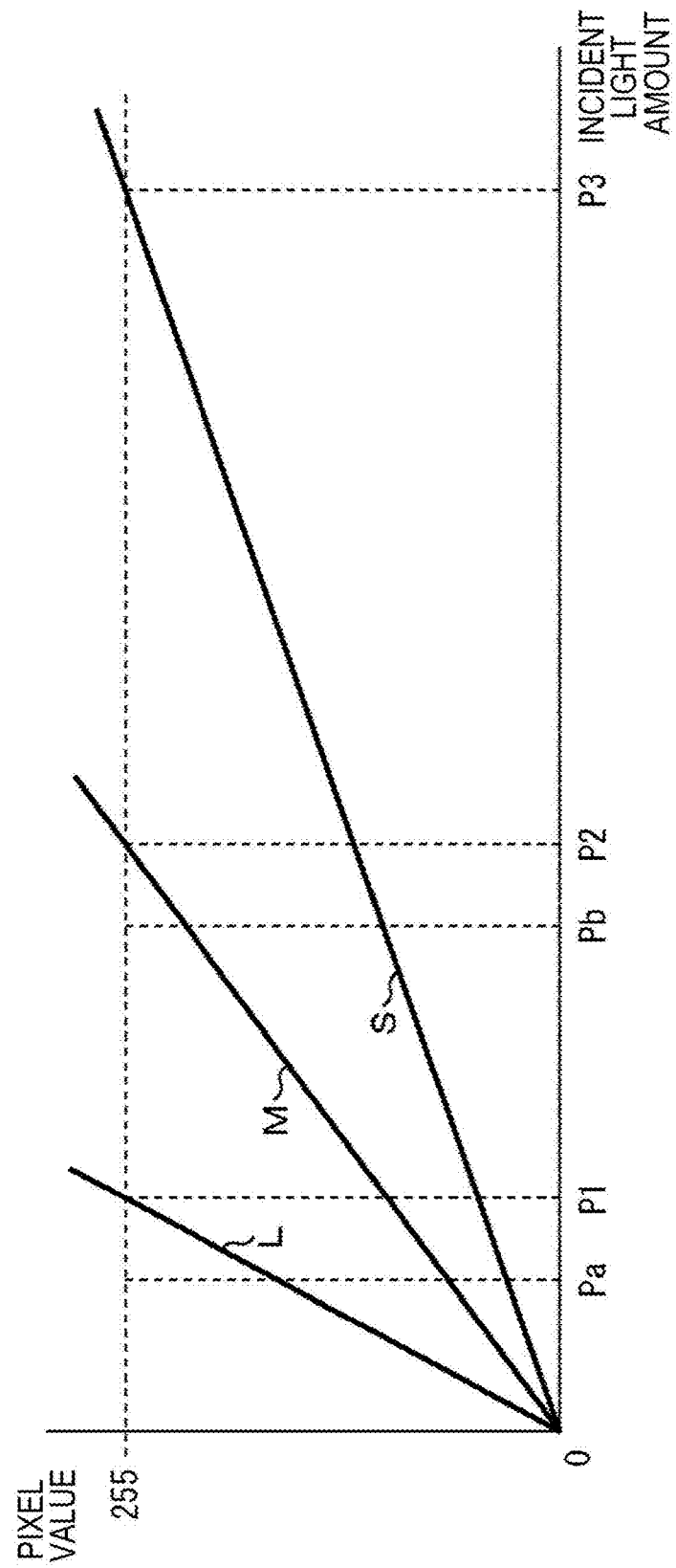
FIG. 24 is a graph schematically illustrating a second example of characteristics of pixel signals.

FIG. 24 is a graph schematically illustrating characteristics of pixel signals output from the column processing unit 13, similarly to FIG. 22. A characteristic curve L and a characteristic curve S are the same as those in FIG. 22, and a characteristic curve M indicates a characteristic of the pixel signal of the middle pixel. Note that, hereinafter, the slope of the characteristic curve M is M.

As compared with the small pixel, the middle pixel has higher sensitivity while having a smaller saturation light amount because of a larger light-receiving area. As compared with the large pixel, the middle pixel has lower sensitivity while having a larger saturation light amount because of a smaller light-receiving area. Then, the dynamic range of the middle pixel is a range from the light amount 0 to the light amount P2.

Here, the signal processing unit 17 selects the pixel signal of the large pixel in the range from the light amount 0 to the light amount P1, and outputs the selected pixel signal. On the other hand, the signal processing unit 17 selects the pixel signal of the middle pixel and outputs a signal obtained by multiplying the selected pixel signal by a predetermined coefficient in the range from the light amount P1 to the light amount P2. This coefficient is set, for example, to L/M, which is approximately equal to the ratio of the size of the large pixel (light-receiving area) to the middle pixel. Further, the signal processing unit 17 selects the pixel signal of the small pixel and outputs a signal obtained by multiplying the selected pixel signal by a predetermined coefficient in the range from the light amount P2 to the light amount P3. This coefficient is set to, for example, L/S, which is approximately equal to the ratio of the size of the large pixel (light-receiving area) to the small pixel. In this manner, the pixel signals of the output pixels (the middle pixel and the small pixel) having the second and subsequent sizes are multiplied by the predetermined coefficients.

As a result, the dynamic range is expanded to the range from the light amount 0 to the light amount P3, as compared with a case of using only the large pixel. Further, sensitivity is improved by using the pixel signal of the large pixel having a relatively large light-receiving area, for a dark part of an object (low luminance object). On the other hand, occurrence of white streaks caused by saturation of the photodiode 101 can be prevented by using the pixel signal of the small pixel having a relatively small light-receiving area, for a bright portion of an object (high luminance object).

Figure 25:
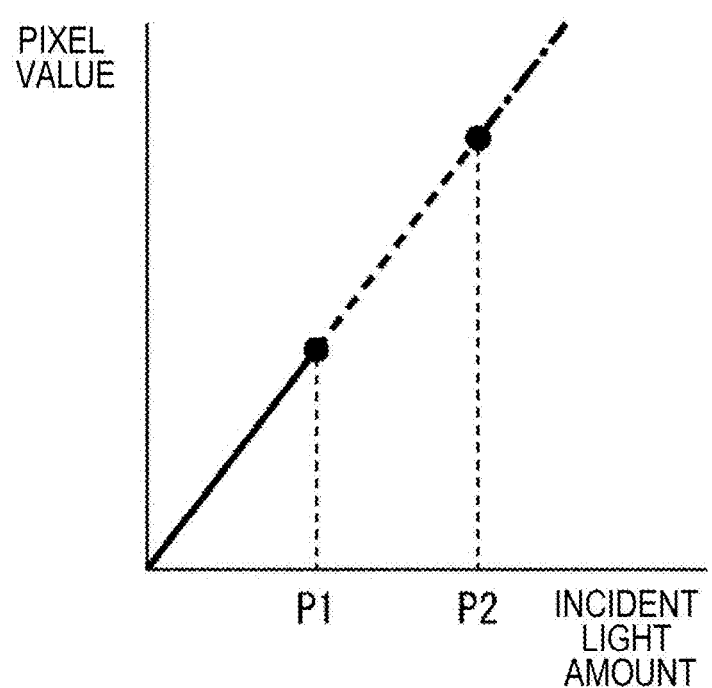
FIG. 25 is a graph schematically illustrating a second example of characteristics of a synthesized signal.

FIG. 25 is a graph schematically illustrating characteristics of a synthesized signal output from the signal processing unit 17 in a case where the synthesis processing described above is performed with reference to FIG. 24. The horizontal axis represents an incident light amount and the vertical axis represents a signal value.

Here, the characteristics of the synthesized signal is changed near the incident light amounts P1 and P2 where switching of the pixel signals occurs. Due to this characteristic change, there is a possibility of occurrence of a phenomenon in which color or brightness is unnaturally changed in spatial direction and temporal direction near the incident light amounts P1 and P2.

On the other hand, a difference between the characteristic curve L of the large pixel and the characteristic curve M of the middle pixel, and a difference between the characteristic curve M of the middle pixel and the characteristic curve S of the small pixel are smaller than a difference between the large characteristic curves L of the large pixel and the small pixel characteristic curve S of the small pixel. Therefore, characteristic change of the synthesized signal near the incident light amounts P1 and P2 in FIG. 25 is smaller than the characteristic change of the synthesis signal at the incident light amount P1 in FIG. 23. With the characteristics, occurrence of the phenomenon in which color or brightness is unnaturally changed in spatial direction and temporal direction near the incident light amounts P1 and P2 can be reduced, as compared with a case of synthesizing two types of pixel signals. As a result, degradation of the image quality of the image based on the image data output from the signal processing unit 17 is suppressed. Note that this effect can be obtained in a case where the sizes of the output pixels of at least one color are three or more types, even if the sizes of the output pixels of all the colors are not three or more types.

Further, when different color arrays are used among the output pixels having different sizes like the basic patterns of FIGS. 2, 7 to 11, 14 to 16, and 20 and 21, areas where the color information is detected can be dispersed. For example, in the example of FIG. 2, the arrangement of the output pixels for detecting the color information of red, green and blue is dispersed. With the configuration, occurrence of false color can be suppressed in the above-described synthesis processing and interpolation processing using color information of peripheral pixels. As a result, degradation of the image quality of the image based on the image data output from the signal processing unit 17 is suppressed. Note that this effect can be obtained in a case where arrangement of the output pixels of at least one color is dispersed, even if arrangement of the output pixels of all the colors is not dispersed.

2. Modifications

Hereinafter, modifications of the above-described embodiment of the present technology will be described.

Modification Regarding Basic Pattern

The above-described basic patterns are examples, and other patterns can be employed.

For example, the number of types of output pixel sizes may be different among colors.

Further, for example, the sizes of output pixels of one or more colors can be set to four or more types.

Further, the sizes of some output pixels can be set to one type.

Further, the type and number of colors can be changed. For example, a combination of R, G, B, W (white), or a combination of colors such as cyan (C), magenta (M), and yellow (Y) can be used.

Modification Regarding Synthesizing Processing

In the pixel signal synthesizing process described above, the pixel signal to be used is switched in accordance with the incident light amount. However, for example, a plurality of pixel signals may be added and outputted.

For example, in the range from the incident light amount Pa to the incident light amount P1 in FIG. 24, the pixel signal of the large pixel and the pixel signal of the middle pixel are selected, and the selected two pixel signals may be added at a predetermined ratio and output. Further, for example, in the range from the incident light amount Pb to the incident light amount P2, the pixel signal of the middle pixel and the pixel signal of the small pixel are selected, and the two selected pixel signals may be added at a predetermined ratio and output.

Other Modifications

In FIG. 1, an example in which the vertical signal line 19 is provided for each basic pattern column has been illustrated. However, the embodiment is not limited to the example, depending on the configuration of the basic pattern pixel group gp. For example, a plurality of the vertical signal lines 19 may be provided for the basic pattern column.

Further, in the above embodiment, an example in which the present technology is applied to a CMOS image sensor having unit pixels arranged in a matrix manner has been described. However, application of the present technology is limited to a CMOS image sensor. That is, the present technology can be applied to all the solid-state image sensors having pixels of different sizes to expand the dynamic range.

Further, the solid-state image sensor to which the present technology is applied may be in a form formed as a single chip, for example, or may be in a modular form having an imaging function, in which an imaging unit and a signal processing unit or an optical system are collectively packaged.

3. Use Example of Solid-State Image Sensor

Figure 26:
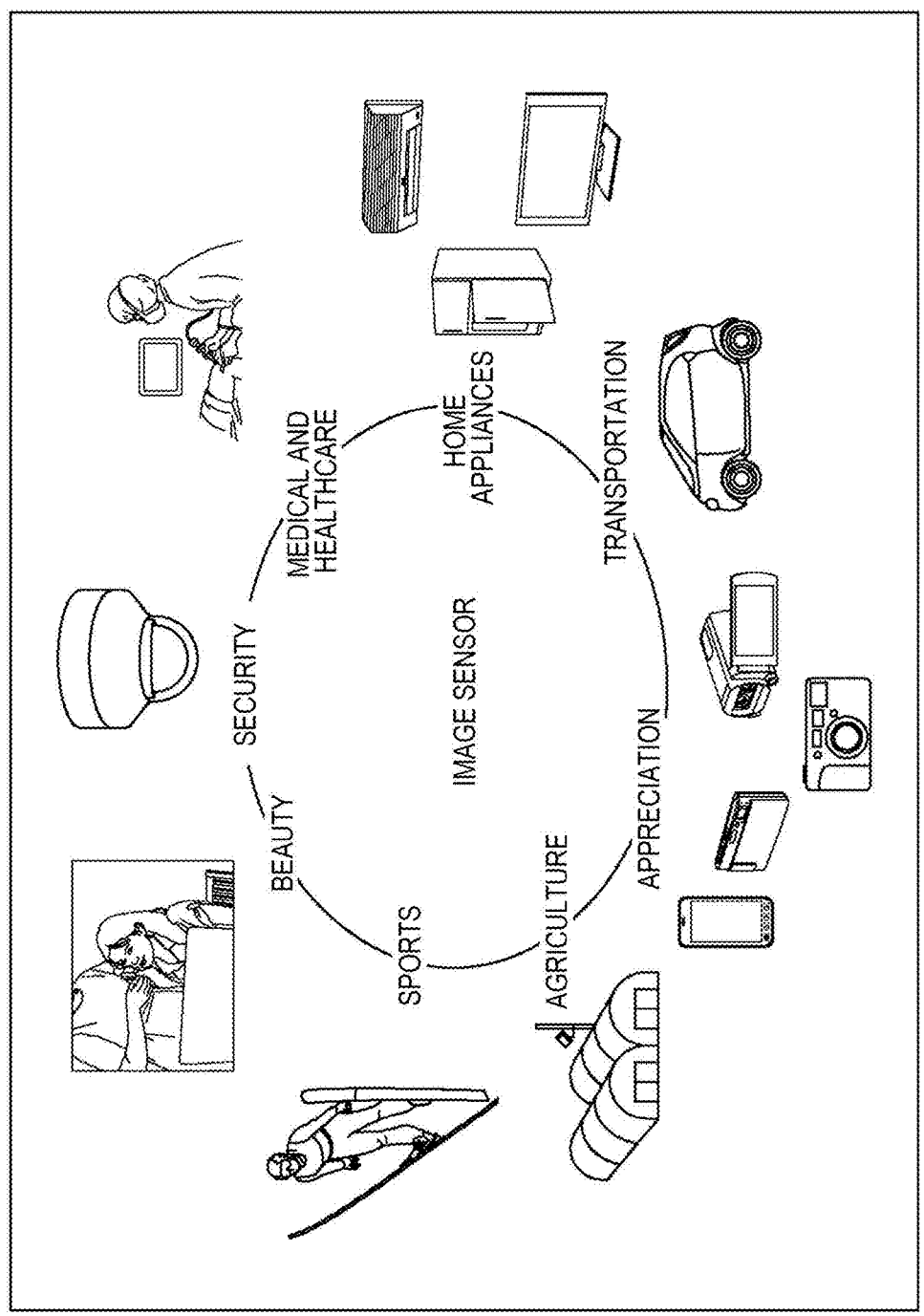
FIG. 26 is a diagram illustrating a use example of the solid-state image sensor.

FIG. 26 is a diagram illustrating a use example of the solid-state image sensor described above.

The above-described solid-state image sensor can be used in various cases for sensing light such as visible light, infrared light, ultraviolet light, and X-ray, as described below, for example.

- Devices that capture images provided for appreciation, such as digital cameras and portable devices with a camera function
- Devices provided for transportation, such as in-vehicle sensors that capture the front, rear, peripheries, an interior of the vehicle, etc. for safe driving such as automatic stop and recognition of a state of a driver, monitoring cameras that monitor traveling vehicles and roads, and distance measuring sensors that measure a distance between vehicles
- Devices provided for home appliances such as TVs, refrigerators, air conditioners, etc. to capture gestures of users and perform device operations according to the gestures
- Devices provided for medical and healthcare, such as endoscopes and devices that perform angiography by receiving infrared light
- Devices provided for security, such as monitoring cameras for crime prevention and cameras for person authentication use
- Devices for beauty, such as skin measuring instruments that captures skin and microscopes that captures scalp
- Devices provided for sports, such as action cameras and wearable cameras for sport use
- Devices provided for agriculture, such as cameras for monitoring the condition of fields and crops

Imaging Device

Figure 27:
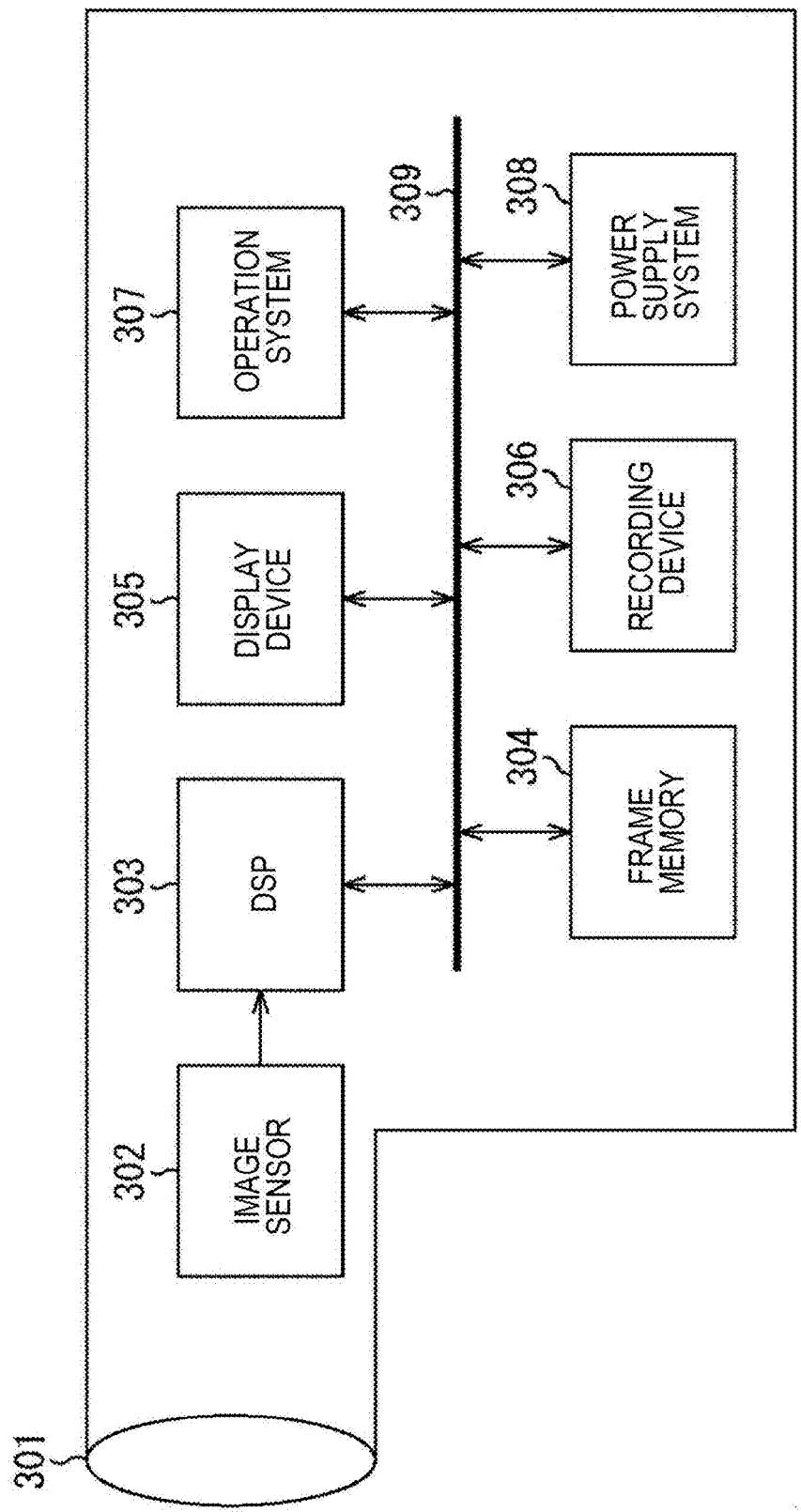
FIG. 27 is a block diagram illustrating a configuration example of an electronic device to which the present technology is applied.

FIG. 27 is a block diagram illustrating a configuration example of an imaging device (camera device) that is an example of an electronic device to which the present technology is applied.

As illustrated in FIG. 27, the imaging device includes an optical system including a lens group 301, an image sensor 302, a DSP circuit 303 that a camera signal processing unit, a frame memory 304, a display device 305, a recording device 306, an operation system 307, a power supply system 308, and the like. Then, the DSP circuit 303, the frame memory 304, the display device 305, the recording device 306, the operation system 307, and the power supply system 308 are mutually connected through a bus line 309.

The lens group 301 takes in incident light (image light) from an object and forms an image on an imaging surface of the image sensor 302. The image sensor 302 converts the light amount of the incident light imaged on the imaging surface by the lens group 301 into an electrical signal in pixel units and outputs the electrical signal as a pixel signal.

The display device 305 is including a panel-type display device such as a liquid crystal display device or an organic electro-luminescence (EL) display device, and displays a moving image or a still image imaged by the image sensor 302. The recording device 306 records a moving image or a still image imaged by the image sensor 302 on a recording medium such as a memory card, a video tape, or a digital versatile disk (DVD).

The operation system 307 issues operation commands about various functions possessed by the imaging device under the operation by the user. The power supply system 308 appropriately supplies various power supplies serving as operating power sources of the DSP circuit 303, the frame memory 304, the display device 305, the recording device 306, and the operation system 307 to these supply targets.

Such an imaging device is applied to a camera module for a mobile device such as a video camera, a digital still camera, a smartphone, or a mobile phone. In addition, in the imaging device, for example, the solid-state image sensor 10 can be used as the image sensor 302. With the configuration, a dynamic range of the imaging device can be expanded, and image quality can be improved.

Note that embodiments of the present technology are not limited to the above-described embodiments, and various modifications can be made without departing from the gist of the present technology.

Further, for example, the present technology can have the following configurations.

(1)

A solid-state image sensor including:

a pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel of at least one color among the output pixels having three or more types of sizes; and a signal processing unit configured to perform synthesis processing for a plurality of the pixel signals from a plurality of the output pixels having a same color and different sizes.

(2)

The solid-state image sensor according to (1), in which the output pixel of each color has two or more types of sizes, and in the pattern, a color array of a first pixel group including a plurality of first output pixels and a color array of a second pixel group including a plurality of second output pixels, the second output pixel having a different size from the first output pixel, are different.

(3)

The solid-state image sensor according to (2), in which the first pixel group surrounds a periphery of the second pixel group.

(4)

The solid-state image sensor according to (2), in which at least one of the first output pixels surrounds a periphery of one of the second output pixels.

(5)

The solid-state image sensor according to (1), in which the output pixel of each color has three or more types of sizes, and in the pattern, a first pixel group including a plurality of first output pixels surrounds a periphery of a second pixel group including a plurality of second output pixels, the second output pixel having a different size from the first output pixel, and the second pixel group surrounds a periphery of a third pixel group including a plurality of third output pixels, the third output pixel having a different size from the second output pixel.

(6)

The solid-state image sensor according to any one of (1) to (5), in which each of the output pixels is configured from one or more unit pixels respectively including light-receiving elements having a same size.

(7)

The solid-state image sensor according to (6), in which the smallest output pixel is configured from the one unit pixel, and each of the pixels having the other sizes is configured from a plurality of the unit pixels.

(8)

The solid-state image sensor according to (6) or (7), in which each of the output pixels is formed by a combination of the unit pixels with wiring.

(9)

The solid-state image sensor according to any one of (1) to (8), in which, in a case where the signal processing unit synthesizes the plurality of pixel signals from a plurality of the output pixels having a same color and three or more types of sizes, the signal processing unit selects one of the plurality of pixel signals according to an incident light amount and outputs the selected pixel signal, and multiplies the pixel signals of the output pixels having second and following sizes by a predetermined coefficient and outputs the multiplied pixel signals.

(10)

The solid-state image sensor according to any one of (1) to (8), in which, in a case where the signal processing unit synthesizes the plurality of pixel signals from a plurality of the output pixels having a same color and three or more types of sizes, the signal processing unit selects two of the plurality of pixel signals according to an incident light amount, and outputs a signal obtained by synthesizing the selected pixel signals at a predetermined ratio.

(11)

An electronic device including:

a solid-state image sensor; and a first signal processing unit configured to process a signal output from the solid-state image sensor, the solid-state image sensor including a pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel of at least one color among the output pixels having three or more types of sizes, and a second signal processing unit configured to perform synthesis processing for a plurality of the pixel signals from a plurality of the output pixels having a same color and different sizes.

(12)

A solid-state image sensor including:

a pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel having two or more types of sizes for each color, and in the pattern, a color array of a first pixel group including a plurality of first output pixels and a color array of a second pixel group including a plurality of second output pixels, the second output pixel having a different size from the first output pixel, are different; and a signal processing unit configured to perform synthesis processing for a plurality of the pixel signals from a plurality of the output pixels having a same color and different sizes.

(13)

The solid-state image sensor according to (12), in which the first pixel group surrounds a periphery of the second pixel group.

(14)

The solid-state image sensor according to (12), in which at least one of the first output pixels surrounds a periphery of one of the second output pixels.

(15)

The solid-state image sensor according to any one of (12) to (14), in which each of the output pixels is configured from one or more unit pixels respectively including light-receiving elements having a same size.

(16)

The solid-state image sensor according to (15), in which the smallest output pixel is configured from the one unit pixel, and each of the pixels having the other sizes is configured from a plurality of the unit pixels.

(17)

The solid-state image sensor according to (15) or (16), in which each of the output pixels is formed by a combination of the unit pixels with wiring.

(18)

An electronic device including:

a solid-state image sensor; and a first signal processing unit configured to process a signal output from the solid-state image sensor, the solid-state image sensor including a pixel unit in which basic pattern pixel groups are arranged, each of the basic pattern pixel groups having output pixels of a plurality of colors arranged according to a predetermined pattern, the output pixel being a pixel based on an output unit of a pixel signal, the output pixel having two or more types of sizes for each color, and in the pattern, a color array of a first pixel group including a plurality of first output pixels and a color array of a second pixel group including a plurality of second output pixels, the second output pixel having a different size from the first output pixel, are different, and a second signal processing unit configured to perform synthesis processing for a plurality of the pixel signals from a plurality of the output pixels having a same color and different sizes.

REFERENCE SIGNS LIST

10 Solid-state image sensor
11 Pixel unit
13 Column processing unit
17 Signal processing unit
18-1 to 18-M Pixel drive line
19-1 to 19-N Vertical signal line
100 Same color pixel group
101-1 to 101-3 Photodiode
102-1 to 102-3 Transfer transistor
103 Reset transistor
104 Floating diffusion
105 Amplifier transistor
106 Selection transistor
gp (1, 1) to gp (M, N) Basic pattern pixel group
R1 to R3, G1a to G3a, G1b to G3b, and B1 to B3 Output pixel

The invention claimed is:

1. A solid-state image sensor comprising:

a pixel unit in which pattern pixel groups are arranged, each of the pattern pixel groups having output pixels of a plurality of colors arranged according to a predetermined pattern, the output pixel being a pixel based on an output unit of a pixel signal, the output pixel of at least one color among the output pixels having three or more types of sizes; and a signal processing unit configured to perform synthesis processing for a plurality of the pixel signals from a plurality of the output pixels having a same color and different sizes;

wherein each of the output pixels is configured from one or more unit pixels respectively including light-receiving elements having a same size;

wherein the smallest output pixel is configured from one unit pixel, and each of the pixels having the other sizes is configured from a plurality of the unit pixels.

2. The solid-state image sensor according to claim 1, wherein the output pixel of each color has two or more types of sizes, and in the pattern, a color array of a first pixel group including a plurality of first output pixels and a color array of a second pixel group including a plurality of second output pixels, each second output pixel having a different size from each first output pixel, are different.

3. The solid-state image sensor according to claim 2, wherein the first pixel group surrounds a periphery of the second pixel group.

4. The solid-state image sensor according to claim 2, wherein at least one of the first output pixels surrounds a periphery of one of the second output pixels.

5. The solid-state image sensor according to claim 1, wherein the output pixel of each color has three or more types of sizes, and in the pattern, a first pixel group including a plurality of first output pixels surrounds a periphery of a second pixel group including a plurality of second output pixels, the second output pixel having a different size from the first output pixel, and the second pixel group surrounds a periphery of a third pixel group including a plurality of third output pixels, the third output pixel having a different size from the second output pixel.

6. The solid-state image sensor according to claim 1, wherein each of the output pixels is formed by a combination of the unit pixels with wiring.

7. The solid-state image sensor according to claim 1, wherein, in a case where the signal processing unit synthesizes the plurality of pixel signals from a plurality of the output pixels having a same color and three or more types of sizes, the signal processing unit selects one of the plurality of pixel signals according to an incident light amount and outputs the selected pixel signal, and multiplies the pixel signals of the output pixels having second and third sizes by a predetermined coefficient and outputs the multiplied pixel signals.

8. The solid-state image sensor according to claim 1, wherein, in a case where the signal processing unit synthesizes the plurality of pixel signals from a plurality of the output pixels having a same color and three or more types of sizes, the signal processing unit selects two of the plurality of pixel signals according to an incident light amount, and outputs a signal obtained by synthesizing the selected pixel signals at a predetermined ratio.

9. A solid-state image sensor comprising:

a pixel unit in which pattern pixel groups are arranged, each of the pattern pixel groups having output pixels of a plurality of colors arranged according to a predetermined pattern, the output pixel being a pixel based on an output unit of a pixel signal, the output pixel having two or more types of sizes for each color, and in the pattern, a color array of a first pixel group including a plurality of first output pixels and a color array of a second pixel group including a plurality of second output pixels, each second output pixel having a different size from each first output pixel, are different; and a signal processing unit configured to perform synthesis processing for a plurality of the pixel signals from a plurality of the output pixels having a same color and different sizes;

wherein each of the output pixels is configured from one or more unit pixels respectively including light-receiving elements having a same size;

wherein the smallest output pixel is configured from one unit pixel, and each of the pixels having the other sizes is configured from a plurality of the unit pixels.

10. The solid-state image sensor according to claim 9, wherein
the first pixel group surrounds a periphery of the second pixel group.

11. The solid-state image sensor according to claim 9, wherein
at least one of the first output pixels surrounds a periphery of one of the second output pixels.

12. The solid-state image sensor according to claim 9, wherein
each of the output pixels is formed by a combination of the unit pixels with wiring.

13. An electronic device comprising:
a solid-state image sensor; and
a first signal processing unit configured to process a signal output from the solid-state image sensor,
the solid-state image sensor including
a pixel unit in which pattern pixel groups are arranged, each of the pattern pixel groups having output pixels of a plurality of colors arranged according to a predetermined pattern, the output pixel being a pixel based on an output unit of a pixel signal, the output pixel of at least one color among the output pixels having three or more types of sizes, and a second signal processing unit configured to perform synthesis processing for a plurality of the pixel signals from a plurality of the output pixels having a same color and different sizes;

wherein in a case where the second signal processing unit synthesizes the plurality of pixel signals from a plurality of the output pixels having a same color and three or more types of sizes, the second signal processing unit selects two of the plurality of pixel signals according to an incident light amount, and outputs a signal obtained by synthesizing the selected pixel signals at a predetermined ratio.

14. An electronic device comprising:
a solid-state image sensor; and
a first signal processing unit configured to process a signal output from the solid-state image sensor,
the solid-state image sensor including
a pixel unit in which pattern pixel groups are arranged, each of the pattern pixel groups having output pixels of a plurality of colors arranged according to a predetermined pattern, the output pixel being a pixel based on an output unit of a pixel signal, the output pixel having two or more types of sizes for each color, and in the pattern, a color array of a first pixel group including a plurality of first output pixels and a color array of a second pixel group including a plurality of second output pixels, each second output pixel having a different size from each first output pixel, are different, and a second signal processing unit configured to perform synthesis processing for a plurality of the pixel signals from a plurality of the output pixels having a same color and different sizes;

wherein in a case where the second signal processing unit synthesizes the plurality of pixel signals from a plurality of the output pixels having a same color and three or more types of sizes, the second signal processing unit selects two of the plurality of pixel signals according to an incident light amount, and outputs a signal obtained by synthesizing the selected pixel signals at a predetermined ratio.

* * * * *